US009830957B1

United States Patent
Zhu et al.

(10) Patent No.: US 9,830,957 B1
(45) Date of Patent: Nov. 28, 2017

(54) SYSTEM AND METHOD OF MEMORY ELECTRICAL REPAIR

(71) Applicant: Marvell International Ltd., Hamilton (BM)

(72) Inventors: Jun Zhu, San Jose, CA (US); Akanksha Mehta, Mountain View, CA (US); Akshay Chandra, Santa Clara, CA (US); Ting Qu, San Jose, CA (US); Saswat Mishra, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/379,567

(22) Filed: Dec. 15, 2016

Related U.S. Application Data

(63) Continuation of application No. 14/835,446, filed on Aug. 25, 2015, now Pat. No. 9,536,590.

(60) Provisional application No. 62/045,374, filed on Sep. 3, 2014.

(51) Int. Cl.
*G11C 7/22* (2006.01)
*G11C 7/10* (2006.01)
*G11C 7/08* (2006.01)
*G11C 8/10* (2006.01)

(52) U.S. Cl.
CPC .............. *G11C 7/10* (2013.01); *G11C 7/08* (2013.01); *G11C 7/222* (2013.01); *G11C 8/10* (2013.01)

(58) Field of Classification Search
CPC .................... G11C 7/22; G11C 8/10
USPC .............................. 365/191, 230.06
See application file for complete search history.

(56) References Cited

U.S. PATENT DOCUMENTS

| | | | |
|---|---|---|---|
| 5,737,766 A * | 4/1998 | Tan | H03K 19/1736 365/189.08 |
| 7,751,264 B1 | 7/2010 | Wu | |
| 7,973,556 B1 * | 7/2011 | Noguera Serra | H03K 19/0016 326/38 |
| 8,711,650 B2 | 4/2014 | Ayukawa | |
| 2009/0210731 A1 * | 8/2009 | Lakkapragada | H03K 19/0016 713/320 |
| 2009/0213645 A1 * | 8/2009 | Parkinson | G11C 11/56 365/163 |
| 2011/0089970 A1 | 4/2011 | Chandler | |
| 2011/0227708 A1 | 9/2011 | Takahashi | |
| 2011/0278657 A1 | 11/2011 | Lim | |
| 2012/0039106 A1 | 2/2012 | Hui | |
| 2012/0202529 A1 | 8/2012 | Mr. Boucher | |
| 2012/0262992 A1 | 10/2012 | Ayukawa | |
| 2013/0078921 A1 | 3/2013 | Wilson | |
| 2013/0156146 A1 | 6/2013 | Hutchings | |
| 2013/0185527 A1 | 7/2013 | Puckett | |
| 2014/0304475 A1 * | 10/2014 | Ramanujan | G06F 12/0895 711/128 |

(Continued)

*Primary Examiner* — Michael Tran

(57) ABSTRACT

Aspects of the disclosure provide an integrated circuit (IC) chip having a memory controller. The memory controller includes a memory interface circuit configured to interface the IC chip with a memory chip having a memory array, and a first control circuit. The memory chip has a configuration circuit for adjusting one or more configurations of the memory chip. The first control circuit is configured to control the memory interface circuit and to communicate with the configuration circuit in the memory chip via the memory interface circuit to adjust the one or more configurations of the memory chip.

20 Claims, 6 Drawing Sheets

(56) References Cited

U.S. PATENT DOCUMENTS

2014/0351239 A1* 11/2014 Davis ................ G06F 17/30483
  707/718
2014/0359200 A1* 12/2014 Tam ..................... G11C 7/1006
  711/103
2015/0357034 A1* 12/2015 Robinett ............ G11C 13/0026
  365/63

* cited by examiner

SYSTEM AND METHOD OF MEMORY ELECTRICAL REPAIR

INCORPORATION BY REFERENCE

This application is a continuation of U.S. application Ser. No. 14/835,446, filed Aug. 25, 2015, which claims the benefit of U.S. Provisional Application No. 62/045,374, "SYSTEM AND METHOD OF MEMORY ELECTRICAL REPAIR" filed on Sep. 3, 2014. The disclosures of the applications referenced above are incorporated herein by reference in their entireties.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

During packaging and/or assembling processes, integrated circuit (IC) devices may experience heat and pressure that affect electrical parameters. The IC devices may perform differently after the packaging and assembly processes. The production yield can be affected by the performance changes, and the production cost for the IC devices increases.

SUMMARY

Aspects of the disclosure provide an integrated circuit (IC) chip having a memory controller. The memory controller includes a memory interface circuit configured to interface the IC chip with a memory chip having a memory array, and a first control circuit. The memory chip has a configuration circuit for adjusting one or more configurations of the memory chip. The first control circuit is configured to control the memory interface circuit and to communicate with the configuration circuit in the memory chip via the memory interface circuit to adjust the one or more configurations of the memory chip.

According to an aspect of the disclosure, the memory controller includes a second control circuit configured to control the memory interface circuit and to access the memory array via the memory interface circuit. Further, the memory controller includes a mode controller configured to switch the control of the memory interface circuit between the first control circuit and the second control circuit. In an example, the mode controller is configured to signal a mode change to the memory chip via the memory interface circuit to allow the memory chip to switch mode. Further, the mode controller is configured to control a clock generator to adjust a frequency of a clock signal provided to the memory chip. In an example, the mode controller comprises one or more registers with bits defined to switch the control of the memory interface circuit between the first control circuit and the second control circuit.

In an embodiment, the first control circuit includes one or more queues to store commands and data to the memory chip. The one or more queues are accessible to a processing unit, such as a central processing unit (CPU).

According to an aspect of the disclosure, the first control circuit is configured to communicate with the configuration circuit in the memory chip to adjust one or more sense amplifier gains. In an example, the sense amplifier gains are adjusted by programming registers in the memory chip or burning e-fuses in the memory chip. In an embodiment, the first control circuit is configured to provide address signals to be decoded to locate the one or more sense amplifiers, provide control signals to be decoded to control the gain adjustment, and provide data signals to be decoded into an amount of the gain adjustment.

Aspects of the disclosure provide a method for memory repair. The method includes signaling, via a memory interface circuit in an integrated circuit (IC) chip that interfaces the IC chip with a memory chip, to the memory chip to switch the memory chip to a configuration mode to adjust one or more configurations of the memory chip after an assembling process that assembles the IC chip with the memory chip, and providing, via the memory interface circuit, instructions to a configuration circuit in the memory chip to adjust one or more configurations of the memory chip.

Aspects of the disclosure provide an apparatus. The apparatus includes a memory chip having a memory array and a configuration circuit for adjusting one or more configurations of the memory chip, and an integrated circuit (IC) chip that is assembled with the memory chip in the apparatus. The IC chip has a memory controller. The memory controller includes a memory interface circuit configured to interface the IC chip with a memory chip and a first control circuit configured to control the memory interface circuit and to communicate with the configuration circuit in the memory chip via the memory interface circuit to adjust the one or more configurations of the memory chip.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
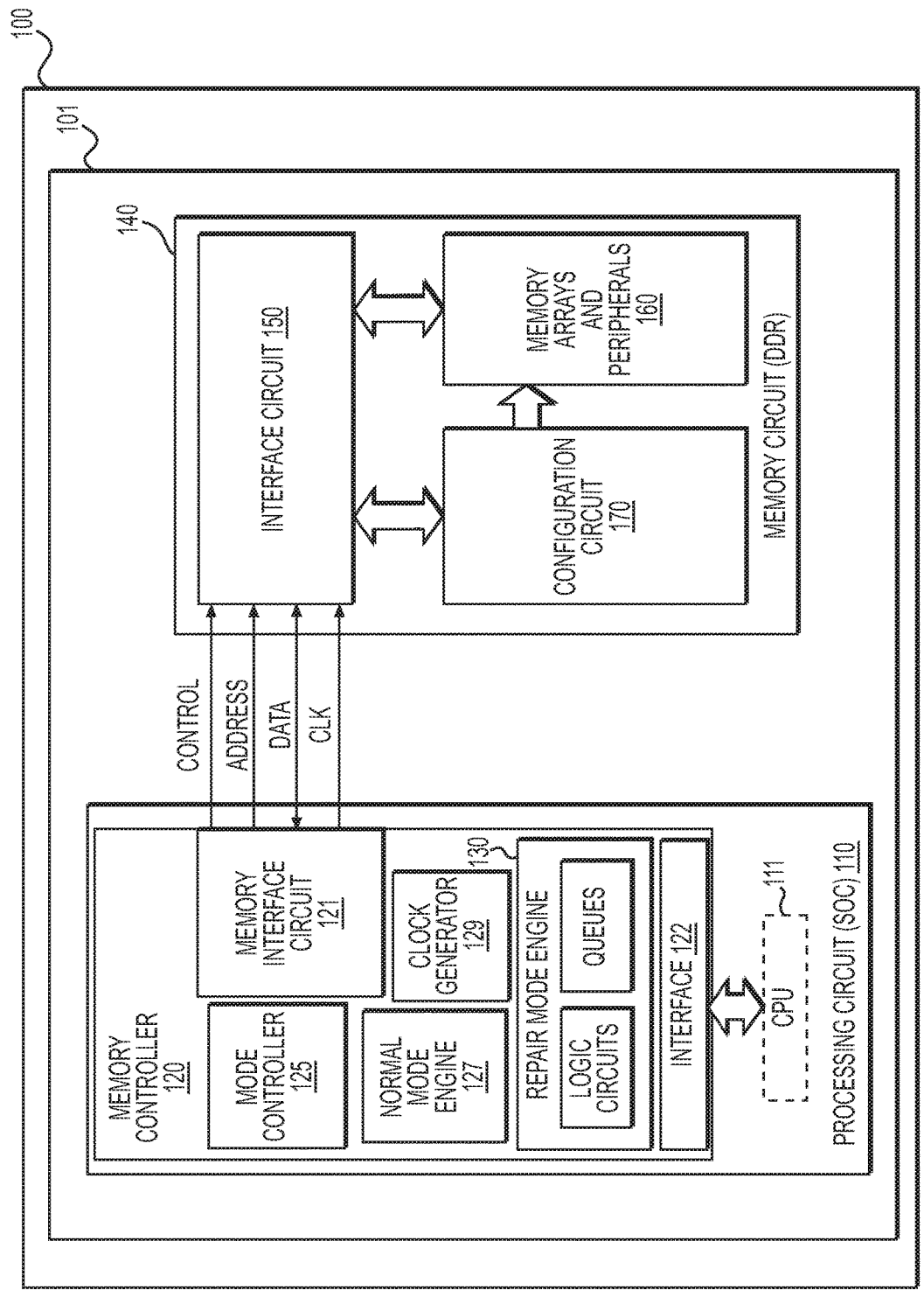
FIG. 1 shows a block diagram of an electronic device 100 according to an embodiment of the disclosure.

FIG. 1 shows a block diagram of an electronic device example 100 according to an embodiment of the disclosure. The electronic device 100 includes a memory circuit 140 and a processing circuit 110 coupled together as shown in FIG. 1. The processing circuit 110 is configured to test the memory circuit 140 and control the memory circuit 140 to perform memory repair.

The electronic device 100 can be any suitably device, such as a desktop computer, a laptop computer, a tablet computer, a smart phone, a network switch, a modem, a television, and the like that includes the memory circuit 140 and the processing circuit 110. The memory circuit 140 and the processing circuit 110 are suitably coupled together. In an embodiment, the memory circuit 140 is on a first integrated circuit (IC) die, the processing circuit 110 is on a second IC die, and the first IC die and the second IC die are bonded and assembled in a package 101, such as a multi-chip module (MCM), and the like. It is noted that two or more dies can be boned and assembled in the package 101.

In another embodiment, the memory circuit 140 is assembled in a first package, the processing circuit 110 is assembled in a second package, and the first package and the second package are bonded on a printed circuit board (PCB) 101. It is noted that other suitable electrical components can be bonded on the PCB 101.

According to an aspect of the disclosure, the memory circuit 140 and the processing circuit 110 are tested separately before being coupled together. During assembling and/or bonding processes that assemble and couple the memory circuit 140 and the processing circuit 110 together, the memory circuit 140 and the processing circuit 110 experience certain environmental conditions, such as heat, high pressure, and the like, that can cause electrical parameters to shift. In an example, the memory circuit 140 is a dynamic random access memory (DRAM) circuit and retention time is used to define the time a DRAM memory cell can retain enough charge to be read correctly without being refreshed. The retention time may vary due to the heat and/or pressure during the assembling process and the bonding process. The variable retention time can cause the electronic device 100 to miss performance requirement, and affect production yield and increase cost.

According to an aspect of the disclosure, the memory circuit 140 includes a configuration circuit 170 that is used to adjust configuration of the memory circuit 140, and the processing circuit 110 is configured to communicate with the configuration circuit 170 to adjust the configuration of the memory circuit 140 in order to meet performance requirement.

In an example, the configuration circuit 170 is configured to be able to adjust sense amplifier gains. Sense amplifiers are used to read memory cells. Generally, the gains of the sense amplifiers are determined to compromise various considerations, such as power consumption, speed, size, and the like. Larger gains enable the sense amplifiers to correctly read memory cells even though the charge levels in the memory cells are relatively low. For example, when the retention time for a memory cell shifts shorter, the memory cell may hold less charge to be read correctly by a sense amplifier without gain adjustment. When the gain of the sense amplifier increases, the sense amplifier is able to read the memory cell with less charge.

In an embodiment, the processing circuit 110 is configured to test the memory circuit 140, for example after the components of the electronic device 100 are assembled together. Based on the testing, the processing circuit 110 diagnoses, for example, variable retention time in the memory circuit 140. Then, the processing circuit 110 communicates with the memory circuit 140 to cause the configuration circuit 170 to adjust one or more parameters, such as amplifier gains and the like, to compensate for the variable retention time.

In an embodiment, the memory circuit 140 is a double data rate synchronous DRAM (DDR SDRAM) memory circuit that includes an interface circuit 150, memory arrays and peripherals 160 and the configuration circuit 170 coupled together as shown in FIG. 1.

The memory arrays and peripherals 160 include memory arrays, sense amplifiers, row decoders, column decoders, and the like. In an embodiment, the sense amplifiers have adjustable gains.

The configuration circuit 170 is able to configure the memory arrays and peripherals 160. In an example, the configuration circuit 170 can adjust the gain of one or more sense amplifiers in the memory arrays and peripherals 160.

The interface circuit 150 includes various circuits to enable communication between the internal circuits (e.g., the configuration circuit 170 and the memory arrays and peripherals 160) of the memory circuit 140 and the external circuits (e.g., processing circuit 110). In an example, the interface circuit 150 includes I/O circuits (not shown) to receive external signals and/or drive signals out of the memory circuit 101, registers (not shown) to buffer the received external signals, decoder circuits (not shown) to receive command signals and decode the command signals, control logic circuits (not shown) to generate suitable internal control signals in response to the command signals, clock circuits (not shown) to generate internal clocks based on the received clock signals, on-die termination (ODT) circuits for impedance matching, and the like.

The processing circuit 110 includes a memory controller 120 configured to control signals to and from the memory circuit 140. In an embodiment, the processing circuit 110 is implemented as a system on chip (SOC) that can include other suitable circuit components, such as a central processing unit (CPU) 111, a graphics processing unit (GPU) (not shown), a static random access memory (SRAM) (not shown), a flash memory (not shown), a read-only memory (ROM) (not shown), a phase-locked loop (PLL) (not shown), analog circuits (not shown), a voltage regulator (not shown), and the like.

According to an aspect of the disclosure, the memory controller 120 and the memory circuit 140 can communicate in a normal mode and a repair mode. In the normal mode, the memory controller 120 communicates with the memory arrays and peripherals 160, for example, to write data to the memory arrays and/or to read data from the memory arrays. In the repair mode, the memory controller 120 communicates with the configuration circuit 170, for example, to collect present configuration information for the memory arrays and peripherals 160, and/or to instruct the configuration circuit 170 to adjust the configurations of the memory arrays and peripherals 160.

In an embodiment, the memory controller 120 is configured to manage signals from and to the memory circuit 140 according to different protocols in the normal mode and the repair mode, and is configured to control a smooth switch procedure from one mode to another mode. In an example, initially at a power up, the memory controller 120 and the memory circuit 140 operate in the normal mode and communicate in the normal mode. At a time to perform memory repair, the memory controller 120 switches to the repair mode, and further communicates with the memory circuit 140 according to a suitable protocol to inform the memory circuit 140, such that the memory circuit 140 switches from the normal mode to the repair mode. Then the memory controller 120 and the memory circuit 140 communicate in the repair mode to perform electrical memory repair in the memory circuit 140. After memory repair, the memory controller 120 returns to the normal mode, and communicates with the memory circuit 140 to inform the memory circuit 140, thus the memory circuit 140 returns to the normal mode.

In the FIG. 1 example, the memory controller 120 includes a normal mode engine 127, a repair mode engine 130, a mode controller 125, a memory interface circuit 121, a clock generator 129, and an interface 122 coupled together as shown in FIG. 1. The normal mode engine 127 includes circuits configured to manage data flows going to and from the memory circuit 140 in the normal mode, and the repair mode engine 130 includes circuits configured to manage data flows going to and from the memory circuit 140 in the repair mode. The mode controller 125 includes circuits configured to control the mode switch.

Specifically, the memory interface 121 includes various circuits to transmit signals to the memory circuit 140 and receive signals from the memory circuit 140. In an embodiment, the memory interface circuit 121 includes I/O circuits (not shown) to receive external signals coming into the processing circuit 110 and/or drive signals out of the processing circuit 110. In the FIG. 1 example, the memory interface circuit 121 drives control signals (CONTROL), address signals (ADDRESS), data signals (DATA) and a clock signal (CLK) to the memory circuit 140 and can receive for example data signals (DATA), status signals (not shown), and the like, from the memory circuit 140.

In an example, the memory circuit 140 is DDR type DRAM, and the memory interface circuit 121 is a DDR physical interface for coupling the memory controller 120 to the memory circuit 140. For example, the memory circuit 140 includes a control pin CSn for selection or de-selection of the memory circuit 140. The memory circuit 140 is configured to operate in response to a signal received on the CSn pin. The memory interface circuit 121 includes a driving circuit that is suitably coupled to the CSn pin to drive a control signal CSn to the CSn pin. The memory circuit 140 includes other control pins, such as RASn, CASn, Wen, CKE, RESETn, ODT, DM and the like for different control purposes, and the memory interface circuit 121 includes driving circuits coupled to the control pins to drive control signals, such as RASn signal, CASn signal, Wen signal, CKE signal, RESETn signal, ODT signal, DM signal, and the like to the control pins.

It is noted that the memory interface circuit 121 includes other suitable interface circuits, such as delay locked-loop (DLL) circuit, and the like.

The interface 122 is configured to enable the memory controller 120 to communication with other components in the electronic device 100. In an example, the interface 122 is configured to enable the memory controller 120 to communication with a processing unit, such as the CPU 111, and the like. For example, the interface 122 is configured to provide data read back from the memory circuit 140 to the CPU 111, and is configured to enable the CPU 111 to write commands and data into the memory controller 120.

The normal mode engine 127 is configured to manage memory array access to the memory circuit 140 over the memory interface circuit 121 according to suitable memory access protocol in the normal mode. In an example, the memory circuit 140 is a DDR type DRAM. The normal mode engine 127 includes suitable circuitry implemented according to suitable DDR access protocol to control the memory interface circuit 121 and perform read access and write access to the memory arrays in the memory circuit 140.

The repair mode engine 130 includes suitable circuitry to control the memory interface circuit 121 and to communicate with the configuration circuit 170 in the memory circuit 140 in the repair mode in order to configure the memory arrays and peripherals 160 for example for memory repair.

In an embodiment, the repair mode engine 130 is implemented as a configurable engine. In an example, the memory circuit 140 can be provided by a plurality of memory vendors. Different memory vendors can decode control signals in different manners.

In an embodiment, the repair mode engine 130 is configurable in response to the vendor of the memory circuit 140. Thus, the repair mode engine 130 can provide suitable control signals to the memory circuit 140. In an example, the repair mode engine 130 includes a plurality of queues, such as command queue, data queue, and the like and logic circuits. The queues can be programmed by the CPU 111, and the logic circuits can manage operations on the queues. For example, based on the vendor of the memory circuit 140, the CPU 111 executes suitable software to generate commands and data that can be decoded by the memory circuit 140, then the CPU 111 programs the command queue and data queue according to the generated commands and data. The repair mode engine 130 then controls the transmission of the commands and/or data in the queues to the memory circuit 140.

The mode controller 125 is configured to control the switch from one operation mode to another operation mode. In an example, the communication between the memory controller 120 and the memory circuit 140 is performed at different frequencies under the different operation modes. In an example, the memory circuit 140 is configured to operate based on a relatively high frequency, such as about 800 MHz in the normal mode and is configured to operate based on a relatively low frequency, such as about 150 MHz in the repair mode. In the example, the mode controller 125 is configured to control the clock generator 129 to generate the clock signal CLK of appropriate frequency based on the operation mode.

In another example, the mode controller 125 is configured to signal the memory circuit 140 of a mode change, such that the memory circuit 140 can enter suitable operation mode accordingly. For example, the mode controller 125 is configured to use a hand-shake process to instruct the memory circuit 140 of a mode change and receive confirmation from the memory circuit 140 of the mode change.

In another example, the mode controller 125 is configured to enable a smooth control transfer of the memory interface circuit 121 between the multiple engines without affecting the operations of the memory circuit 140. In an example, the normal mode engine 127 is a core and default engine, and is active when the processing circuit 110 is powered up. When a memory repair is needed, the mode controller 125 releases the normal mode engine 130 from the control of the memory interface circuit 121, and lets the repair mode engine 130 to take the control of the memory interface circuit 121. When the memory repair is done, the mode controller 125 returns the control of the memory interface circuit 121 to the normal mode engine 130.

During the mode transfer, the mode controller 125 is configured to set signals, such as the control signals (CONTROL), the address signals (ADDRESS), the data signals (DATA), and the like at appropriate values to not affect the operation of the memory circuit 140.

It is noted that the memory circuit 140 can be provided by different vendors who implement the memory circuit 140 according to different protocols to cause the memory circuit 140 to enter the repair mode. In one such embodiment, the memory circuit 140 is configured to enter the repair mode when the memory circuit 140 receives a non-operation (NOP) command for a relatively large number of clock cycles (e.g., over ten cycles). In an example, the memory circuit 140 decodes a low voltage level (e.g., about ground level) on the CSn pin as an NOP command and ignores all the other control signals on the control pins in response to the NOP command. In the example, at a time to change the operation mode to the repair mode, the mode controller 125 is configured to drive the control signal CSn of the low voltage level for a large number of clock cycles, such as over ten cycles and the like, to inform the mode change to the memory circuit 140.

According to an aspect of the disclosure, the mode controller 125 includes a plurality of registers to control the mode transfer. The memory controller 120 includes circuits to drive the control signals according to the values in the registers. The registers can be suitably defined by any suitable technique. Appendix A shows an example of a set of registers.

In an embodiment, the registers are used to control the operations of the normal mode engine 127 and the repair mode engine 130. In an example, the registers provide control and state information for command queue (CMD_Q) and data queue (DQ_RW_FIFO) operations in the repair mode engine 130. In an example, the command queue includes 32 entries to store up to 32 repair mode commands. In an embodiment, the CPU 111 can execute software instructions to read or write the command queue using register read or register write. For example, the command queue is mapped to a register MRE_CMD_ENTRY (see Appendix A), and another register MRE_CMD_Q_CTRL (see Appendix A) keeps control variables for the command queue operation. In an example, MRE_CMD_Q_CTRL [CMD_Q_PRG_MODE] (e.g., [2:1]) has two bits that are used to indicate mode for the command queue operation.

According to an aspect of the disclosure, the command queue has a first-in-first-out operation mode and a direct access operation mode. In an embodiment, when the command queue is in first-in-first-out operation mode, pointers are used to access entries in the command queue. For example, a read pointer (e.g., CMD_Q_RPTR) is used to point to next reading address in the command queue, and a write pointer (e.g., CMD_Q_WPTR) is used to point to next writing address in the command queue. In an example, the CPU 111 can reset the read pointer and the write pointer when the command queue is initialized. In an example, to read the command queue, the CPU 111 executes a register read of the register MRE_CMD_ENTRY, then the entry in the command queue that is pointed by the read pointer (e.g., entry CMD_Q[CMD_Q_RPTR]) is read back. After the reading, the read pointer increases by one to point to next entry for reading. In an example, to write the command queue, the CPU 111 executes a register write to write a value to the register MRE_CMD_ENTRY, the value is stored at an entry in the command queue that is pointed by the write pointer (e.g. entry CMD_Q[CMD_Q_WPTR]). After the writing, the write pointer increases by one to point to next entry for writing.

In another embodiment, the command queue (CMD_Q) is in a direct access operation mode that allows the CPU 111 to execute software to read or write entries in the command queue through the direct address defined by an address (e.g., CMD_Q_ADDR). The CPU 111 executes software instructions to program CMD_Q_PRG_MODE in the register MRE_CMD_Q_CTRL to indicate direct access operation mode, and program CMD_Q_ADDR in the register MRE_CMD_Q_CTRL to indicate the address for direct access.

In an example, to read the command queue, the CPU 111 executes a register read of the register MRE_CMD_ENTRY, the value stored at the entry CMD_Q[CMD_Q_ADDR] is read back, then the CPU 111 executes software instruction to update CMD_Q_ADDR for next entry. To write a value in the command queue, the CPU 111 executes a register write of the register MRE_CMD_ENTRY, the value is written to the entry CMD_Q[CMD_Q_ADDR], then the CPU 111 executes software instruction to update the CMD_Q_ADDR.

Similarly, the registers can be used to control data queue operation. In an embodiment, the data queue (e.g., DQ_R-W_FIFO) has a plurality of entries respectively associated with entries of the command queue. In an example, the data queue includes 32 entries to store data associated with 32 entries in the command queue in a one-to-one correspondence. The CPU 111 can read or write the data queue using register read or register write. In an embodiment, the data queue is mapped to the associated register that has the same size as the memory interface data bus width. In an example, data bus includes 72 bits, thus the data queue is mapped to a 72 bit register. For example, bits [71:0] of the data queue is mapped to the MRE_DQ_FIFO [71:0] register. Thus, the CPU 111 can use register read and register write to read or write the data queue.

In an embodiment, the memory controller 120 operates according to a five-phase procedure to switch between the normal mode and the repair mode without affecting the operations of the memory circuit 140. The five-phase procedure will be explained in detail with reference to FIG. 2.

Further, in an embodiment, in the repair mode, the repair mode engine 130 controls processes of command queue runs to communicate with the memory circuit 140. The command queue runs are explained in detail with reference to FIG. 3-6.

Figure 2:
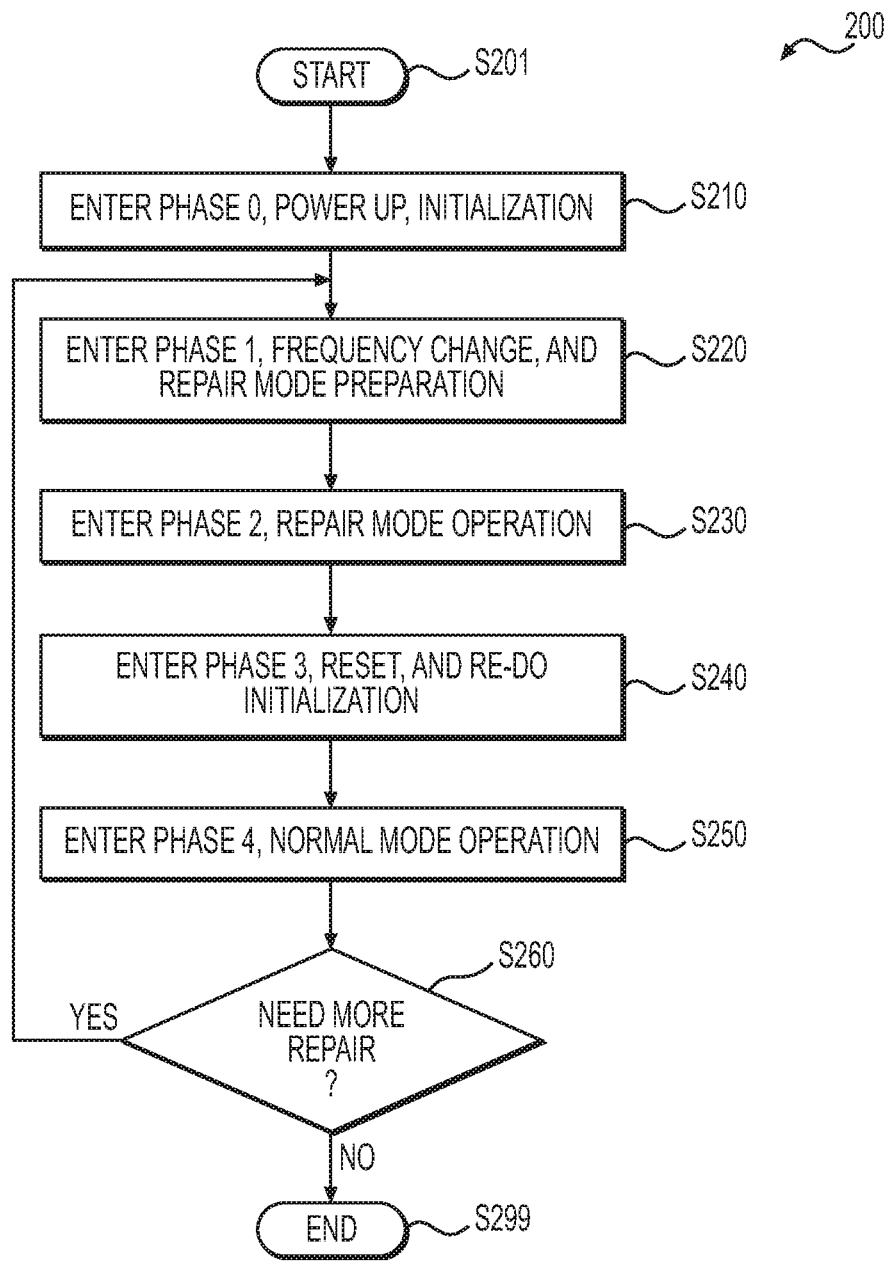
FIG. 2 shows a flow chart outlining a process example 200 to switch operation modes between a normal mode and a repair mode according to an embodiment of the disclosure.

FIG. 2 shows a flow chart outlining a process example 200 to switch operation modes between a normal mode and a repair mode according to an embodiment of the disclosure. In the FIG. 1 example, the process 200 is executed by the memory controller 120. The process 200 is a five-phase process that starts at S201 and proceeds to S210.

At S210, the memory controller 120 is powered up and enters phase 0. In phase 0, the memory controller 120 powers up in the normal mode and performs initializations and calibrations. In an example, the normal mode engine 127 is a core and default engine. For example, when the memory controller 120 is powered up, the registers in the mode controller 125 have default values to let the normal mode engine 127 take the control of the memory interface circuit 121. The normal mode engine 127 is initialized, then the memory interface circuit 121 is initialized. The clock generator 129 generates the clock signal CLK of the relatively high frequency, such as 800 MHz, and the memory interface circuit 121 provides the clock signal CLK to the memory circuit 140. Further, the memory controller 120 performs various calibrations, such as a delay-locked loop (DLL) calibration for the clock signal (CLK), read and write leveling calibration to compensate for unbalanced load of the signal lines, data strobe signal (DQS) gate training calibration to setup the timing of the read strobe, memory interface circuit driving strength calibration, and the like.

At S220, the memory controller 120 enters phase 1. In phase 1, the memory controller 120 switches from the normal mode to the repair mode. For example, the CPU 111 executes register write to program one or more registers (e.g., the register MRE_MODE_CTRL in Appendix A) in the mode controller 125 of appropriate values to trigger mode change. Then, the mode controller 125 causes the mode change. In an example, the CPU 111 changes a bit (e.g., REPAIR_MODE_REQ) in the register MRE_MOD- E_CTRL from low to high, then the mode controller 125 lets the repair mode engine 130 takes the control of the memory interface circuit 121.

In an example, the mode controller 125 causes the clock generator 129 to generate the clock signal CLK of the relatively low frequency, such as 150 MHz, and the memory interface circuit 121 provides the clock signal CLK of the relatively low frequency to the memory circuit 140. The memory controller 120 and the memory circuit 140 then operate based on the clock signal CLK of the relatively low frequency.

Further, in an example, the mode controller 125 sets signals values to enable smooth mode transfer. For example, bits of a control register (e.g., MRE_MODE_CTRL in Appendix A) are used to define values of control signals during a time duration from entering the repair mode to a first command in the repair mode. The bits of the control register are suitably programmed to set the control signals, such as RASn signal, CASn signal, Wen signal, CKE signal, RESETn signal, ODT signal, DM signal, CSn signal, and the like.

In another example, according to bits in the control register that define the state for the control signal CSn, a sequence of continuous logic "0" is driven to the CSn pin of the memory circuit 140 by the memory interface circuit 121 to indicate continuous NOP commands. In an example, the memory circuit 140 is configured to decode the continuous NOP commands as an instruction to enter the repair mode. Thus, in response to the continuous NOP commands, the memory circuit 140 enters the repair mode to enable the configuration circuit 170 to communicate with the processing circuit 110 and to configure the memory arrays and peripherals 160.

At S230, the memory controller 120 enters phase 2. In phase 2, the repair mode engine 130 takes control of the memory interface circuit 140. In an embodiment, the memory interface circuit 121 maintains certain configurations, such as pad driving/termination strength, DLL settings, delay line settings, and the like unchanged. Further, the CPU 111 executes software instructions to generate suitable commands and data for communication with the memory circuit 140. The repair mode engine 130 then sends the commands and the data to the memory circuit 140 via the memory interface circuit 121. In response to the commands and data, the memory circuit 140 performs suitable memory repair.

In an example, the CPU 111 determines that a gain of a sense amplifier in the memory circuit 140 needs to be increased by a certain amount to offset a variable retention time error. The CPU 111 generates suitable commands and data to instruct the memory circuit 140. The repair mode engine 130 then send the command and data to the memory circuit 140 via the memory interface circuit 121. For example, the control signals are used to indicate an instruction (e.g., gain adjustment instruction), the address signals are used to indicate which sense amplifier, and the data signals are used to indicate the amount of gain adjustment. In phase 2, the memory controller 120 and the memory circuit 140 work at 150 MHz. The command queue executions are explained in detail with reference to FIG. 3-6.

At S240, the memory controller 120 enters phase 3. In phase 3, in an example, the memory controller 120 and the memory circuit 140 return to the normal mode. In an example, the CPU 111 executes software to write suitable values to the control register to allow the normal mode engine 127 to take control of the memory interface circuit 121. Further, in the example, the memory interface circuit 121 drives logic "1" to the CSn pin of the memory circuit 140 to set the memory circuit 140 in the normal mode. In addition, the clock generator 129 in the memory controller 120 generates the clock signal CLK of 800 MHz, and the clock signal CLK is provided to the memory circuit 140.

In an embodiment, in the normal mode, the memory controller 120 performs initialization and calibration again. For example, the memory controller 120 is initialized, then the memory interface circuit 121 is initialized, and the memory circuit 140 is initialized. Further, the memory controller 120 performs calibrations, such as a delay-locked loop (DLL) calibration for the clock signal (CLK), and the like.

At S250, the memory controller 120 enters phase 4. In phase 4, the memory controller 120 and the memory circuit 140 perform normal memory operations at the relatively high clock frequency, such as 800 MHz. In an example, when a component of the electronic device 100, such as the CPU 111 and the like, needs to access the memory array in the memory circuit 140, the normal mode engine 127 controls the memory interface circuit 121 to communicate with the memory circuit 140 and access the memory arrays in the memory circuit 140. In another example, the CPU 111 executes software instructions to test the memory circuit 140. For example, via the memory controller 120, the CPU 111 writes test vectors into certain memory addresses in the memory arrays of the memory circuit 140. Further, via the memory controller 120, the CPU 111 reads back stored values from the memory addresses, and checks the correctness of the stored values.

At S260, the processing circuit 110 determines whether more repair work is needed for the memory circuit 140. When more repair work is needed, the process returns to S220; otherwise, the process proceeds to S299 and terminates.

According to an aspect of the disclosure, in phase 2, the repair mode engine 130 takes over the control of the memory interface circuit 121. The memory interface circuit 121 can maintain certain configuration settings, such as pad driving/termination strength, DLL settings, delay line settings, and the like unchanged in phase 2. The repair mode engine 130 provides commands to the memory circuit 140 via the memory interface circuit 121 as rounds of command queue runs. A command queue run can be a read run to read from the memory circuit 140 or can be a write run to write to the memory circuit 140.

Figure 3:
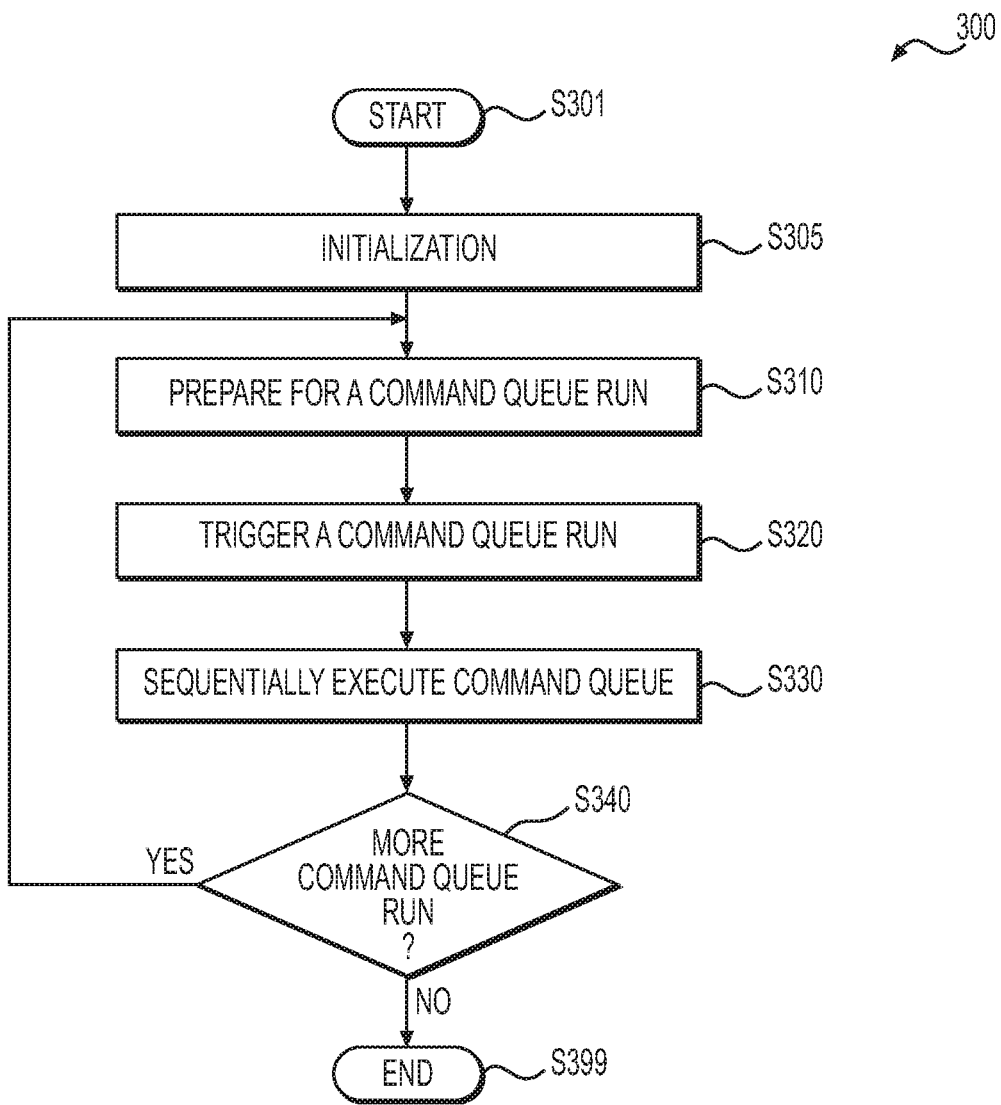
FIG. 3 shows a flow chart outlining a process example 300 for executing command queue runs.

FIG. 3 shows a flow chart outlining a process example 300 for executing command queue runs. In the FIG. 1 example, the process 300 is executed in the memory controller 120 by the repair mode engine 130. The process starts at S301, and proceeds to S305.

At S305, initialization in the repair mode is performed. In an example, the memory controller 120 enters the repair mode, the repair mode engine 130 takes control of the memory interface circuit 121 and initializes the memory interface circuit 121. In an example, a control register (e.g., MRE_MODE_CTRL) includes bits (e.g., MODE_ENT_CTRL_STATE) that specify states of the control signals during the time duration from the entry of the repair mode to the first command in the repair mode. The memory interface circuit 121 is initialized according to the bits in the control register.

At S310, preparation for a command queue run is performed. For example, the repair mode engine 130 includes registers, a command queue (e.g., CMD_Q) and a data queue (e.g. DQ_RW_FIFO). The repair mode engine 130 prepares the registers, the command queue and the data queue for the command run. In an embodiment, the data queue may still buffer data read previously. To avoid data loss, the data queue is read and the data is stored into a memory space.

Further, the repair mode engine 130 programs the control register (e.g., MRE_MODE_CTRL) to set control signals CSn, ODT and DM. Then, commands are loaded into the command queue. In an embodiment, different IC chip manufactures for the memory circuit 140 may use commands in different formats to instruct the memory circuit 140 to change configuration. In an example, the memory circuit 140 is identified, and the command format can be determined. Then, according to the determined format, the CPU 111 executes software to generate suitable commands associated with the memory circuit 140, and the commands are loaded into the command queue via the interface 122.

In an example, read commands and write commands are used in the repair mode. For example, read commands are used to read the present configuration information in the memory circuit 140, and write commands are used to change the configuration of the memory circuit 140. In an embodiment, commands are provided in the form of read command run and write command run. In a read command run, one or more read commands are provided to the memory circuit 140, and in a write run, one or more write commands are provide to the memory circuit 140. In an example, the command queue includes 32 entries. For a read run, the command queue can buffer up to 32 read commands, and for a write run, the command queue can buffer up to 32 write commands.

At S320, a command queue run is triggered. In an example, for a write run, the repair mode engine 130 sets up command queue control signals WR and CKE. For a read run, the repair mode engine 130 sets up command queue control signals RD and CKE. In the example, the memory controller 120 includes a run control register (e.g., MRE_RUN_CTRL0 in Appendix A). In the example, a trigger bit in the run control register (e.g., RUN_START in Appendix A) is used to trigger a command queue run. In an embodiment, a command queue run is defined as the in order execution of commands in the command queue. In an example, a rising edge of the trigger bit (logic "0"→logic "1") triggers the execution of a command queue run that executes commands in the command queue in order. In an example, the trigger bit is toggled by the CPU 111 according to software instructions.

At S330, the commands in the command queue are sequentially executed. In an example, a command queue run starts from a first entry of the command queue in the CMD_Q. In an embodiment, the memory controller 120 includes a run state register (e.g., MRE_RUN_STAT in Appendix A). In the example, a state bit in the run state register, (e.g. RUN_DONE) is used to indicate whether the command queue run is finished. In an embodiment, when all the commands in the command queue are executed, the state bit changes from logic "0" to logic "1" to indicate the command queue run is done. When the command queue run is finished, in an example, the CPU 111 executes software to read suitable status and data in the data queue.

At S340, the process branches based on a decision whether there is more command queue run. When there is more command queue run, the process returns to S310; otherwise, the memory controller 120 exits the repair mode, the repair mode engine 130 releases the control of the memory interface circuit 121, the normal mode engine 127 takes over the control of the memory interface circuit 121, and process proceeds to S399 and terminates.

Figures 4A, 4B:
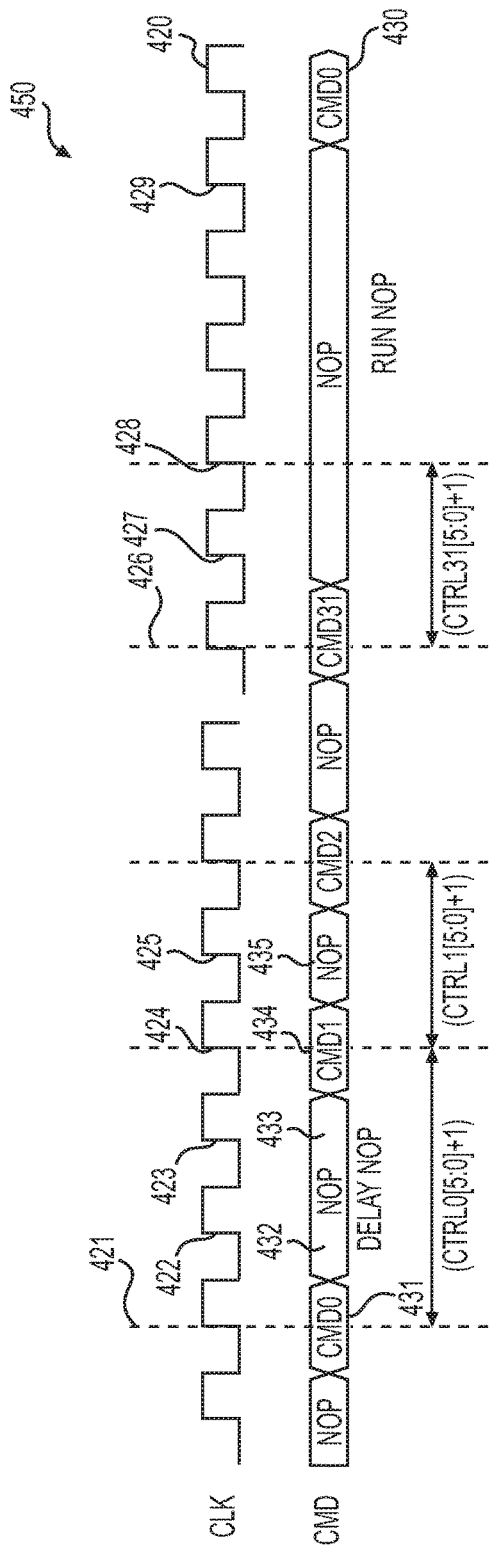
FIGS. 4A and 4B show an example illustrating a command queue run according to an embodiment of the disclosure.

FIGS. 4A and 4B show an example illustrating a command queue run according to an embodiment of the disclosure. FIG. 4A shows a command queue example 410 according to an embodiment of the disclosure. The command queue 410 includes 32 entries ENTRY0-ENTRY31. Each entry includes a command field 411 and a control field 412. In an example, the command field 411 includes bit values for the control signals and the address signals that form the command, and the control field 412 includes control values for the command. In an example, the control field 412 includes a number for indicating a number of NOP cycles after the command cycle.

FIG. 4B show a plot 450 of command flow in a command queue run according to an embodiment of the disclosure. The plot 450 includes a waveform 420 of the clock signal CLK and a command flow 430 for the command queue run that executes the commands in the command queue 410.

In the example, at a clock cycle 421, signals, such as control signals, address signals, and the like according to the first command CMD0 are output to drive the suitable pins of the memory circuit 140. The first command CMD0 takes one clock cycle. At clock cycles 422 and 423, control signals corresponding to NOP command are output to drive the suitable pins of the memory circuit 140. In the example, the number of NOP command cycles (e.g., 2) after the first command CMD0 is indicated by bits[5:0] of the first control CTRL0.

Further, at a clock cycle 424, signals, such as control signals, address signals, and the like according to the second command CMD1 are output to drive the suitable pins of the memory circuit 140. At clock cycle 425, control signals corresponding to NOP command are output to drive the suitable pins of the memory circuit 140. In the example, the number of NOP command cycles (e.g., 1) after the second command CMD1 is indicated by bits[5:0] of the second control CTRL1.

At a clock cycle 426, signals according to the last command CMD31 are output to drive the suitable pins of the memory circuit 140. At clock cycle 427, control signals corresponding to NOP command are output to drive the suitable pins of the memory circuit 140. In the example, the number of NOP command cycles (e.g., 1) are indicated by bits[5:0] of the last control CTRL31.

It is noted that from the clock cycle 421 to the clock cycle 427, commands in the command queue are driven to the memory circuit 140 in order according to the control values in the commands. From clock cycle 428 to clock cycle 429, the repair mode engine 130 configures registers and queues for a next command queue run, and a plurality of NOP commands are output to drive the suitable pins of the memory circuit 140 from clock cycle 428 to clock cycle 429.

Figure 5:
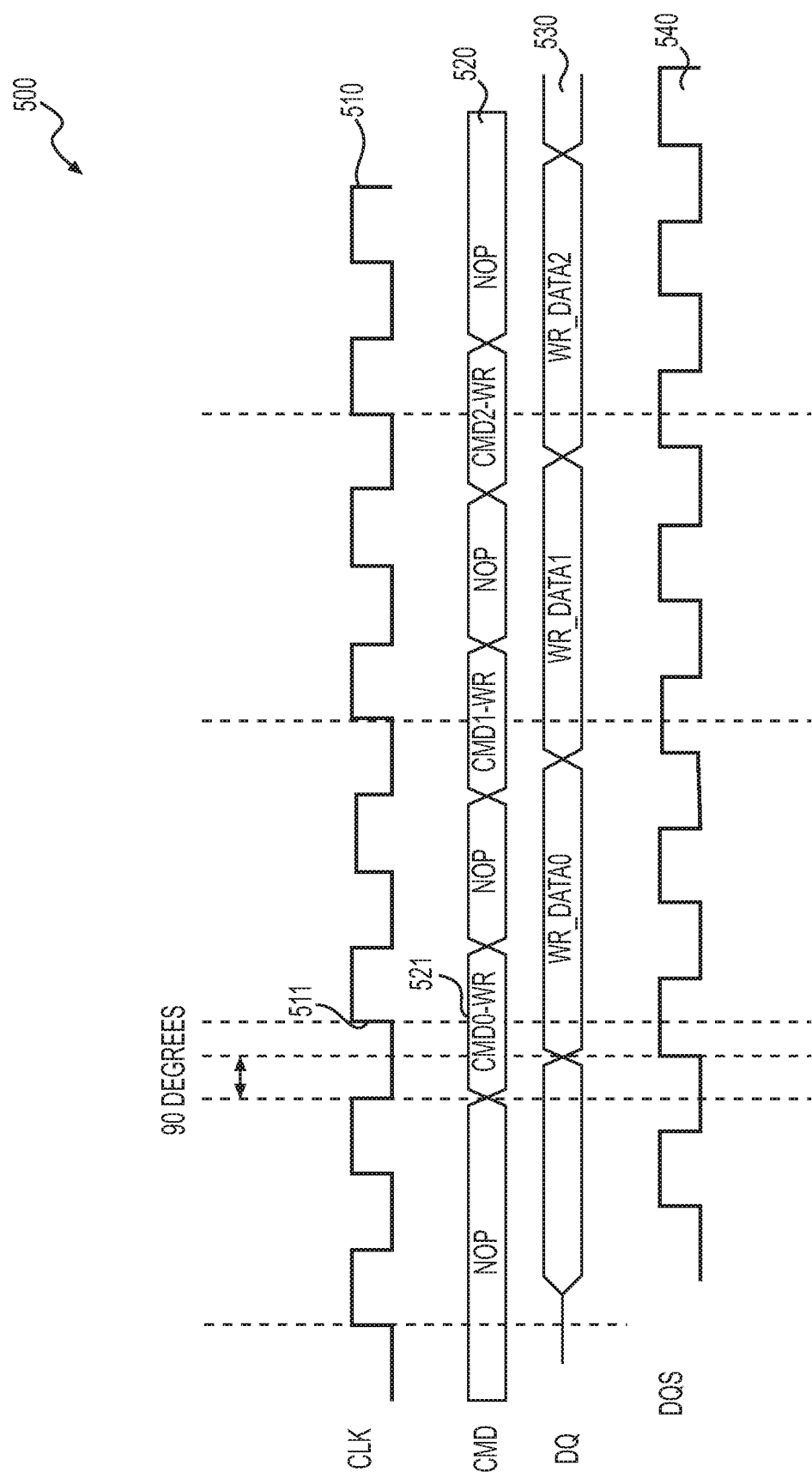
FIG. 5 shows a plot 500 of command flow and data flow for a write run according to an embodiment of the disclosure.

FIG. 5 shows a plot 500 of command flow and data flow for a write run according to an embodiment of the disclosure. The plot 500 includes a waveform 510 of the clock signal CLK, a command flow 520 for the write run, a data flow 530 for the data driven to the memory circuit 140, and a waveform 540 for the write strobe driven to the memory circuit 140.

At a clock cycle 511, signals, such as control signals, address signals and the like according to the first write command CMD0-WR are output to drive the suitable pins of the memory circuit 140. The write command period is one clock cycle.

After the first write command, NOP command is driven to the memory circuit 140 for a plurality of clock cycles. In an embodiment, the number of clock cycles for the NOP command is determined as a function of an operation mode of the processing circuit 110 and the control (CTRL0) for the first write command. For example, when the processing circuit 110 is in a slow operation mode (e.g., ×2 mode), the number of clock cycles for the NOP command is determined by the value in the CTRL0[5:0]. When the processing circuit 110 is in a fast operation mode (e.g., ×4 mode), the number of clock cycles for the NOP command is calculated by expression CTRL0[5:0]×2+1.

In the FIG. 5 example, there is a 90 degree shift between the write strobe/write data (DQS/DQ) and the clock signal CLK.

Figure 6:
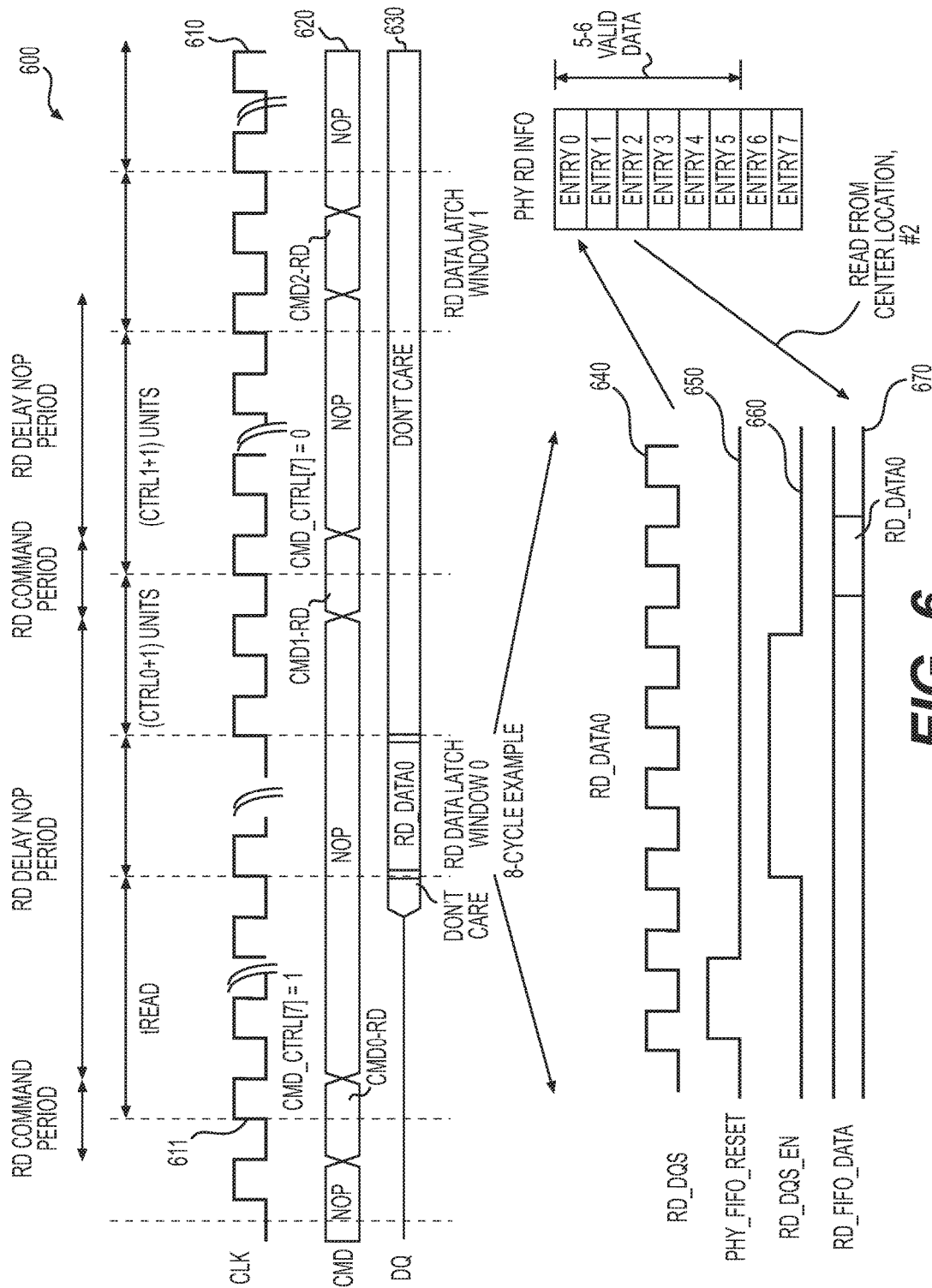
FIG. 6 shows a plot 600 of command flow and data flow for a read run according to an embodiment of the disclosure.

FIG. 6 shows a plot 600 of command flow and data flow for a read run according to an embodiment of the disclosure. The plot 600 includes a waveform 610 of the clock signal CLK, a command flow 620 for the write run, a data flow 630 for the data read from the memory circuit 140, a waveform 640 for the read strobe, a waveform 650 for reset signal, a waveform 660 for data queue enable, and data flow 670 for a temporary read FIFO queue.

At a clock cycle 611, signals according to the first read command CMD0-RD are output to drive the suitable pins of the memory circuit 140. The read command period is one clock cycle.

After the first read command, NOP command is driven to the memory circuit 140 for a plurality of clock cycles. The number of clock cycles for the NOP command is calculated as a function of the operation mode, the latch window size, the control (CTRL0) and a parameter tREAD. In an example, the parameter tREAD is a programmable read latency which defines the time difference between the actual read command and the point when RD DQS starts toggling (arrival of read data). The parameter tREAD can be specified in a register field, such as in the register MRE_RUN_CTRL_1[7:0]. In an example to test data retention, a relatively large value can be used in the parameter tREAD.

According to an aspect of the disclosure, due to heat and pressure during the assembling and bonding processes, the time when the read data is driven to the memory interface 121 from the memory circuit 140 is uncertain. In the FIG. 6 example, a latch window is used to repetitively sample data from data pins. In an example, a latch window of 8 cycles is used. Data pins are sampled in 8 cycles, and the sampled data is stored into a temporary read FIFO queue. In an example, valid entries in the temporary read FIFO queue can be determined, and the sampled data in a valid entry is pushed in the data queue (e.g., DQ_RW_FIFO).

In an embodiment, the time when the read data is driven to the memory interface 121 can be determined based on the sampled data in the temporary read FIFO queue. Further, in an example, the time can be used to determine variable retention time.

Appendix A: Register Examples

Register Name: MRE_MODE_CTRL
Address Offset: 0x0
Default Value: 0x0000_1F00

| Bits | Reset value | RW | Name | Function |
|---|---|---|---|---|
| [0] | 1'h0 | RW | REPAIR_MODE_REQ | Request to enter repair mode. In an example, when this bit changes from low to high, the repair mode engine takes control of the memory interface circuit to drive the memory circuit into the repair mode, and asserts REPAIR_MODE_ACK; and when this bit changes from high to low, the repair mode engine releases the control of the memory interface control, the core of the memory controller (e.g. normal mode engine) takes control of the memory interface circuits, and then de-asserts REPAIR_MODE_ACK. DTE_EN has to be set before system requests to enter the repair mode. |
| [4] | 1'b0 | RM | DTE_EN | enable bit. In an example, the enable bit is used to gate off clocks when it's not active.<br>1: enable<br>0: disable |
| [15:8] | 8'h1F | RW | MODE_ENT_CTRL_STATE | Specify the control signals' state during the time duration from entry of the repair mode to the first command in the repair mode. In an example, following is a mapping of the bits to the control signals<br>[8]: RASn<br>[9]: CASn<br>[10]: Wen<br>[11]: CKE<br>[12]: RESETn<br>[13]: ODT<br>[14]: DM<br>[15]: reserved<br>In an example, default interface signal states are applied until the first command in the command queue starts. |
| [19:16] | 4'h0 | RW | MODE_ENT_CS_STATE | Specify the value of the control signal CSn between entry of the repair mode to first command in the repair mode |

| | | | Register Name: MRE_MODE_STAT<br>Address Offset: 0x4<br>Default Value: 0x0000_0000 | |
|---|---|---|---|---|
| Bits | Reset value | RW | Name | Function |
| [0] | 1'h0 | R | REPAIR_MODE_ACK | In an example, high means memory circuit in repair mode and the repair mode engine takes over the control of the memory interface circuit. |

| | | | Register Name: MRE_RUN_CTRL0<br>Address Offset: 0x8<br>Default Value: 0x0000_09F0 | |
|---|---|---|---|---|
| Bits | Reset value | RW | Name | Function |
| [0] | 1'h0 | RW | RUN_START | Trigger bit for command queue run. In an example, a rising edge triggers the execution of the command queue. The execution starts from CMD_Q[0] and. finishes at CMD_Q [CMD_Q_CNT-1]. The trigger bit can be toggled by software. |
| [1] | 1'b0 | RW | RUN_TYPE | Command run type. In an example, 1: Read RUN. 0: Write RUN. |
| [7:4] | 4'hF | RW | RUN_CS | Specify CSn values during a command queue run. In an example, when a command queue run starts, the test mode engine applies this CSn value to the memory interface circuit and keeps them unchanged until next run starts. |
| [8] | 1'b1 | RW | RUN_RESETn | Specify RESETn value during a command queue run. In an example, when a command queue run starts, the test mode engine applies the RESETn value to the reset pins, and keeps them unchanged until next run starts. |
| [9] | 1'b0 | RW | RUN_ODT | Specify ODT value during a command queue run. In an example, when a command queue run starts, the test mode engine applies the ODT value to the ODT pins at the memory interface, and keeps them unchanged until next run starts. |
| [10] | 1'b0 | RW | RUN_DM | Specify DM value during a command queue run. In an example, when a command queue run starts, the test mode engine applies the DM value to the DM pins at the memory interface, and keeps them unchanged until next run starts. |
| [11] | 1'b1 | RW | RUN_CKE | Specify CKE value during the time duration between RUN_DONE and the 1$^{st}$ command of next RUN. |
| [13:12] | 2'b0 | RW | CMD_CTRL_UNIT | Specify the unit of MRE_CMD_ENTRY [CMD_CTR]. In an example, 0: 1 clock cycle/unit 1: 2 clock cycles/unit 2: 4 clock cycles/unit 3: 16 clock cycles/unit |

| | | | Register Name: MRE_RUN_CTRL1<br>Address Offset: 0xC<br>Default Value: 0x0003_4010 | |
|---|---|---|---|---|
| Bits | Reset value | RW | Name | Function |
| [7:0] | 8'h10 | RW | tREAD | Specify tREAD in clock cycles of the memory controller |
| [9:8] | 2'h0 | RW | RD_DQS_WIN_SIZE | Specify Read DQS enable window size in clock cycle of the memory controller, in an example 0: 1 clock cycle 1: 2 clock cycles 2: 4 clock cycles 3: 8 clock cycles |
| [15:10] | 6'h10 | RW | DQ_LAT_WIN_SIZE | Read DQ latch window size in clock cycles of the memory controller. In an example, this value is larger than RD_DQS_WIN_SIZE. |
| [19:16] | 4'h3 | RW | RD_LATCH_ADDR | Read DDR_PRY_RD_HFO[RD_LATCH_ADDR] back and put in DQ_RW_FIFO in read RUN. In an example, the value is in the range from 0 to 7 for memory interface. |
| [20] | 1'b0 | RW | WR_DQS_EN | Effective when RUN_TYPE is defined as write. It determines whether write DQS is on or off from the start of the command queue RUN to end of the last command of the current RUN. In an example, |

Register Name: MRE_RUN_CTRL1
Address Offset: 0xC
Default Value: 0x0003_4010

| Bits | Reset value | RW | Name | Function |
|---|---|---|---|---|
| | | | | 1: enabled write DQS output<br>0: no write DQS output |

Register Name: MRE_RUN_STAT
Address Offset: 0x10
Default Value: 0x0000_0000

| Bits | Reset value | RW | Name | Function |
|---|---|---|---|---|
| [0] | 1'h0 | R | RUN_DONE | State of a command queue run. Reset by RUN_START, and set after all commands in the command queue have been executed. |
| [6:1] | 6'b0 | R | CMD_Q_CNT | Number of active commands in the command queue. |
| [12:7] | 6'h0 | R | CMD_Q_WPTR | CMD_Q write pointer. In an example, this pointer will be reset by CMD_Q_PTR_RST. In CMD_Q_FIFO program mode (CMD_Q_PRG_MODE = 0), writing to register MRE_CMD_ENTRY will increase this pointer value by 1. |
| [18:13] | 6'h0 | R | CAM_Q_RPM | CMD_Q read pointer that points to the command in CMD_Q being executed by test mode engine. In an example, this pointer will be reset by CMD_Q_PTR_RST. When a command run starts, this pointer is reset to 0 for the first command of the run. When current command is done, it will be automatically increased by 1 for next command. |

Register Name: MRE_CMD_Q_CTRL
Address Offset: 0x14
Default Value: 0x0000_0000

| Bits | Reset value | RW | Name | Function |
|---|---|---|---|---|
| [0] | 1'h0 | RW | CMD_Q_PTR_RST | Reset bit for command queue pointer. In an example, a rising edge triggers a reset of CMD_Q_WPTR, CMD_Q_RPTR, CMD_Q_CNT. |
| [2:1] | 2'b0 | RW | CMD_Q_PRG_MODE | Indicate command queue program mode.<br>0: FIFO program mode. In an example, a register write to register MRE_CMD_ENTRY will push the data of MRE_CMD_ENTRY to the FIFO, and the FIFO write pointer will be automatically increased by 1, and the also be automatically increased by 1.<br>1: direct program mode. In an example, a register write to register MRE_CMD_ENTRY will write the data to the command queue location specified by CMD_Q_ADDR.<br>2: command Q read mode, in an example, a register read from register MRE_CMD_ENTRY will read back the data of the command queue location specified by CMD_Q_ADDR.<br>3: reserved. |
| [8:4] | 5'h0 | RW | CMD_Q_ADDR | Command queue direct access address. |
| [16] | 1'b0 | RW | DQ_FIFO_PRT_RST | Reset bit for DQ_FIFO pointer. In an example, a rising edge triggers reset DQ FIFO write pointers (e.g., DQ_FIFO_WPTR0,1,2,3) and read pointers (e.g., DQ_FIFO_ RPTR0,1,2,3). |

| Bits | Reset value | RW | Name | Function |
|---|---|---|---|---|
| | | | Register Name: MRE_CMD_ENTRY Address Offset: 0x18 Default Value: 0x0000_0000 | |
| [23:0] | 24'h0 | RW | DTE_CMD | Repair mode command to be put in the command queue. In an example, the mapping of the bits is defined as following:<br>[0]: RASn<br>[1]: CASn<br>[2]: Wen<br>[3]: CKE, this CKE is the command CKE going with the command in the command cycle.<br>[6:4]: BA[2:0]<br>[7]: reserved<br>[23:8]: ADDR[15:0] |
| [31:24] | 8'h0 | RW | CMD_CTRL | Repair mode command controls.<br>[29:24]: DELAY_NOP_COUNT, the number of NOP commands between present command and next command.<br>[30]: DELAY_NOP_CKE, define the DDR_CKE value for the NOPs between two commands.<br>[31]: READ_DATA_EN, effective for READ RUN. In an example:<br>1: go through read data latch procedure, put data to DQ_RW_FIFO.<br>0: skip read data latch procedure, goes to delay NOPs directly. No data will be latched in DQ_RW_FIFO. |

| Bits | Reset value | RW | Name | Function |
|---|---|---|---|---|
| | | | Register Name: MRE_DO_FIFO Address Offset: 0x1C Default Value: 0x0000_0000 | |
| [31:0] | 32'h0 | RW | RGF_DO_FIFO | This register maps to data queue bits [31:0]. In an example, a register write to this register pushes data in the data queue DO_RW_FIFO[31:0] at a location pointed by DQ_FIFO0_WPTR. Then the pointer DQ_FIFO0_WPTR increases by 1. In an example, a register read from this register will pop data out of DQ_RW_FIFO[31:0] from a location pointed by DQ_FIFO0_RPTR to this register, and DO_FIFO0_RPTR increases by 1. It is noted that, in an example, the data queue DQ_RW_FIFO has a data width matching memory interface data bus width. |

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) chip, comprising:
an interface circuit configured to interface the IC chip with a memory chip configured to adjust one or more configurations of the memory chip;
a mode controller configured to signal, via the interface circuit, to the memory chip to switch the memory chip from a first mode to a second mode; and
a control circuit configured to control the interface circuit and communicate with the memory chip via the interface circuit repairing the memory chip by adjusting the one or more configurations of the memory chip during the second mode, wherein the one or more configurations of the memory chip are not adjusted during the first mode.

2. The IC chip of claim 1, wherein the control circuit is a first control circuit, further comprising:
a second control circuit configured to control the interface circuit and access a memory array of the memory chip via the interface circuit; and
the mode controller configured to switch between the first control circuit and the second control circuit to control the interface circuit.

3. The IC chip of claim 2, wherein the mode controller is configured to signal a mode change to the memory chip via the interface circuit to allow the memory chip to switch mode.

4. The IC chip of claim 2, wherein the mode controller is configured to control a clock generator to adjust a frequency of a clock signal provided to the memory chip.

5. The IC chip of claim 2, wherein the mode controller comprises one or more registers with bits defined to switch between the first control circuit and the second control circuit to control the interface circuit.

6. The IC chip of claim 1, wherein the control circuit includes one or more queues to store commands and data to the memory chip.

7. The IC chip of claim 6, wherein the one or more queues are accessible to a processor.

8. The IC chip of claim 1, wherein the control circuit is configured to communicate with the memory chip to adjust one or more sense amplifier gains.

9. The IC chip of claim 8, wherein the control circuit is configured to provide address signals to be decoded to locate the one or more sense amplifiers.

10. The IC chip of claim 8, wherein the control circuit is configured to provide control signals to be decoded to control the adjustment of one or more sense amplifier gains and provide data signals to be decoded into an amount of the adjustment of one or more sense amplifier gains.

11. A method for memory repair, the method comprising:
adjusting one or more configurations of a memory chip via an interface circuit configured to interface an integrated circuit chip with the memory chip;
signaling, by a mode controller, via the interface circuit, to the memory chip to switch the memory chip from a first mode to a second mode; and
controlling, by a control circuit, the interface circuit and communicating with the memory chip via the interface circuit repairing the memory chip by adjusting the one or more configurations of the memory chip during the second mode, wherein the one or more configurations of the memory chip are not adjusted during the first mode.

12. The method of claim 11, wherein the control circuit is a first control circuit, further comprising:

controlling, by a second control circuit, the interface circuit and accessing a memory array of the memory chip via the interface circuit; and switching, by the mode controller, between the first control circuit and the second control circuit to control the interface circuit.

13. The method of claim 12, further comprising:
signaling, by the mode controller, a mode change to the memory chip via the interface circuit to allow the memory chip to switch mode.

14. The method of claim 12, further comprising:
controlling, by the mode controller, a clock generator to adjust a frequency of a clock signal provided to the memory chip.

15. The method of claim 12, further comprising:
switching between the first control circuit and the second control circuit to control the interface circuit according to bits defined in one or more registers.

16. The method of claim 11, further comprising:
queuing commands and data to store the commands and data to the memory chip.

17. The method of claim 16, further comprising:
accessing the one or more queues by a processor.

18. The method of claim 11, further comprising:
communicating with the memory chip to adjust one or more sense amplifier gains.

19. The method of claim 18, further comprising:
providing address signals to be decoded to locate the one or more sense amplifiers.

20. The method of claim 18, further comprising:
providing control signals to be decoded to control the adjustment of one or more sense amplifier gains; and
providing data signals to be decoded into an amount of the adjustment of one or more sense amplifier gains.

* * * * *